United States Patent
Laddu (10) Patent No.: US 11,973,593 B2
(45) Date of Patent: Apr. 30, 2024

(54) LDPC CODES FOR 3GPP NR ULTRA-RELIABLE LOW-LATENCY COMMUNICATIONS

(71) Applicant: NOKIA TECHNOLOGIES OY, Espoo (FI)

(72) Inventor: Keeth Saliya Jayasinghe Laddu, Piliyandala (LK)

(73) Assignee: Nokia Technologies Oy, Espoo (FI)

( * ) Notice: Subject to any disclaimer, the term of this patent is extended or adjusted under 35 U.S.C. 154(b) by 112 days.

(21) Appl. No.: 16/975,325

(22) PCT Filed: Feb. 23, 2018

(86) PCT No.: PCT/US2018/019544
§ 371 (c)(1),
(2) Date: Aug. 24, 2020

(87) PCT Pub. No.: WO2019/164515
PCT Pub. Date: Aug. 29, 2019

(65) Prior Publication Data
US 2021/0367709 A1    Nov. 25, 2021

(51) Int. Cl.
H04L 1/00    (2006.01)
(52) U.S. Cl.
CPC ................. *H04L 1/0057* (2013.01)
(58) Field of Classification Search
None
See application file for complete search history.

(56) References Cited

U.S. PATENT DOCUMENTS

| | | | | |
|---|---|---|---|---|
| 10,355,822 B2 * | 7/2019 | Patel | ............ | H04L 1/1819 |
| 10,608,665 B2 * | 3/2020 | Lee | ............ | H03M 13/116 |
| 10,903,950 B2 * | 1/2021 | Kim | ............ | H04L 5/001 |
| 10,931,397 B2 * | 2/2021 | Wang | ............ | H04L 1/0026 |
| 10,972,219 B2 * | 4/2021 | Wang | ............ | H03M 13/2778 |
| 11,063,605 B2 * | 7/2021 | Wang | ............ | H03M 13/6508 |
| 11,070,314 B2 * | 7/2021 | Laddu | ............ | H03M 13/6508 |
| 2014/0229788 A1 * | 8/2014 | Richardson | ........ | H03M 13/1188 |
| | | | | 714/752 |

(Continued)

OTHER PUBLICATIONS

International Search Report and Written Opinion dated Jun. 21, 2018 corresponding to International Patent Application No. PCT/US2018/019544.

(Continued)

*Primary Examiner* — Gregory B Sefcheck
(74) *Attorney, Agent, or Firm* — Barta Jones, PLLC (57) ABSTRACT

Various communication systems may benefit from suitable coding schemes. For example, certain wireless communication systems may benefit from using low density parity check and other reliability mechanisms. A method can include communicating at least one transport block for ultra-reliable low-latency communications between a sending device and a receiving device. The transport block can be coded using a base graph according to one of the following three options: using only low density parity check base graph #2; using only low density parity check base graph #2 and truncated low density parity check base graph #1; or using low density parity check base graph #2, truncated low density parity check base graph #1, and low density parity check base graph #3.

7 Claims, 8 Drawing Sheets

NR LDPC base graph structure.

(56) References Cited

U.S. PATENT DOCUMENTS

| | | | | |
|---|---|---|---|---|
| 2014/0331102 | A1* | 11/2014 | Lee | H03M 13/2906 |
| | | | | 714/758 |
| 2015/0082126 | A1* | 3/2015 | Vernon | H03M 13/1108 |
| | | | | 714/774 |
| 2015/0349807 | A1* | 12/2015 | Vernon | H03M 13/1102 |
| | | | | 714/774 |
| 2017/0141798 | A1* | 5/2017 | Kudekar | H03M 13/6362 |
| 2017/0331497 | A1* | 11/2017 | Richardson | H03M 13/036 |
| 2017/0359148 | A1* | 12/2017 | Richardson | H04L 1/0068 |
| 2018/0226989 | A1* | 8/2018 | Soriaga | H03M 13/1102 |
| 2018/0234114 | A1* | 8/2018 | Soriaga | H04L 1/1819 |
| 2019/0013827 | A1* | 1/2019 | Richardson | H03M 13/116 |
| 2019/0260547 | A1* | 8/2019 | Nammi | H04L 1/1825 |
| 2019/0349900 | A1* | 11/2019 | Sarkis | H04L 1/0023 |
| 2020/0067641 | A1* | 2/2020 | Ma | H03M 13/1102 |
| 2020/0106458 | A1* | 4/2020 | Jin | H03M 13/036 |
| 2020/0186168 | A1* | 6/2020 | Wang | H03M 13/6393 |
| 2020/0228142 | A1* | 7/2020 | Sandberg | H04L 1/0041 |
| 2020/0228254 | A1* | 7/2020 | Ma | H04L 1/189 |
| 2020/0235759 | A1* | 7/2020 | Ye | H03M 13/09 |
| 2020/0259508 | A1* | 8/2020 | Li | H03M 13/116 |
| 2020/0266957 | A1* | 8/2020 | Gulati | H04L 1/0067 |
| 2020/0287654 | A1* | 9/2020 | Xi | H03M 13/13 |
| 2020/0313793 | A1* | 10/2020 | Jung | H04L 5/1469 |
| 2020/0374040 | A1* | 11/2020 | Lou | H04L 1/1614 |
| 2021/0013901 | A1* | 1/2021 | Li | H03M 13/6516 |
| 2021/0050930 | A1* | 2/2021 | Li | H04W 72/04 |
| 2021/0067219 | A1* | 3/2021 | Liu | H04B 7/0491 |
| 2021/0160826 | A1* | 5/2021 | Bae | H04L 1/0004 |
| 2021/0211232 | A1* | 7/2021 | Hwang | H04L 5/00 |
| 2021/0306095 | A1* | 9/2021 | Laddu | G06F 11/1004 |

OTHER PUBLICATIONS

Ericsson: "Design of LDPC Codes for NR," 3GPP Draft; R1-1611321, Design of LDPC Codes for NR, 3GPP TSG RAN WG1 Meeting #87, Reno, USA, Nov. 13, 2016, XP051175302.

3GPP TS 38.212 V15.0.1 (Feb. 2018), Technical Specification, 3rd Generation Partnership Project; Technical Specification Group Radio Access Network; NR; Multiplexing and channel coding (Release 15), Feb. 2018, XP051398862.

Qualcomm Incorporated: "TBS and Base-graph Determination," 3GPP Draft; R1-1721479-TBS and Base-Graph Determination, 3GPP TSG RAN WG1 Meeting 91, Reno, USA, Dec. 4, 2017, XP051370720.

Interdigital Inc.: "Code Rate Threshold for LDPC Base Graph Selection," 3GPP Draft; R1-1716486, 3GPP TSG RAN WG1 Meeting NR#3, Nagoya, Japan, Sep. 17, 2017, XP051339939.

Huawei et al., "Chanel coding for URLLC," 3GPP Draft; R1-1800104, 3GPP TSG RAN WG1 Meeting AH 1801, Vancouver, Canada, Jan. 22-26, 2018.

Ericsson, "Channel Coding Techniques for URLLC," 3GPP Draft; R1-1800217, 3GPP TSG RAN WG1 Meeting AH 1801, Vancouver, Canada, Jan. 22-26, 2018.

InterDigital Inc., "On URLLC Data Channel Coding," 3GPP Draft; R1-1800635, 3GPP TSG RAN WG1 Meeting Ah 1801, Vancouver, Canada, Jan. 22-26, 2018.

* cited by examiner

Figure 1

Figure 2 base graph structure (a) BG#2 dimensions (a) Truncated BG#1 for URLLC

Figure 3

Use of the base graphs (a) option 1 (b) option 2 (c) option 3

Figure 4

NR eMBB LDPC base graphs

| Base graph | Maximum block size | Max code rate | Min code rate | LDPC lifting size | |
|---|---|---|---|---|---|
| | | | | $Z_{min}$ | $Z_{max}$ |
| BG #1 | 8448 | 8/9 | 1/3 | 2 | 384 |
| BG #2 | 3840 | 2/3 | 1/5 | 2 | 384 |

Figure 5

Sets of LDPC lifting size $Z$ (underscore shows example when removal of lifting sizes)

| Set Number | Set of lifting sizes ($Z$) |
|---|---|
| 1 | {2, 4, 8, 16, 32, 64, 128, 256} |
| 2 | {3, 6, 12, 24, 48, 96, 192} |
| 3 | {5, 10, 20, 40, 80, 160} |
| 4 | {7, 14, 28, 56, 112, 224} |
| 5 | {9, 18, 36, 72, 144} |
| 6 | {11, 22, 44, 88, 176} |
| 7 | {13, 26, 52, 104, 208} |
| 8 | {15, 30, 60, 120, 240} |

LDPC CODES FOR 3GPP NR ULTRA-RELIABLE LOW-LATENCY COMMUNICATIONS

BACKGROUND

Field

Various communication systems may benefit from suitable coding schemes. For example, certain wireless communication systems may benefit from using low density parity check and other reliability mechanisms.

Description of the Related Art

New radio (NR) ultra-reliable low-latency communications (URLCC) will utilize a coding scheme. The enhanced mobile broadband (eMBB) coding scheme for NR is using low density parity check (LDPC) and polar codes where details of the designs are specified in 3GPP TS 38.212: "NR; Multiplexing and channel coding."

In the eMBB coding scheme, LDPC codes use two base graphs to support wider range of code rates and block sizes. One base graph (BG #1) supports high to low code rates and block sizes up to 8448. The second base graph (BG #2) is mainly optimized for the lower block size region and medium to lower code rates. Each base graph has eight parity check matrices with different shift coefficient designs, which mainly operate based on different sets of shift sizes. The dimensions of the base graphs are as follows: base graph #1 has 46 rows and 68 columns, and base graph #2 has 42 rows and 52 columns.

The NR URLLC coding scheme has not yet been defined. LDPC is one candidate for the URLLC data channel coding scheme. There some limitations when applying the same LDPC codes to URLLC.

Figure 1:
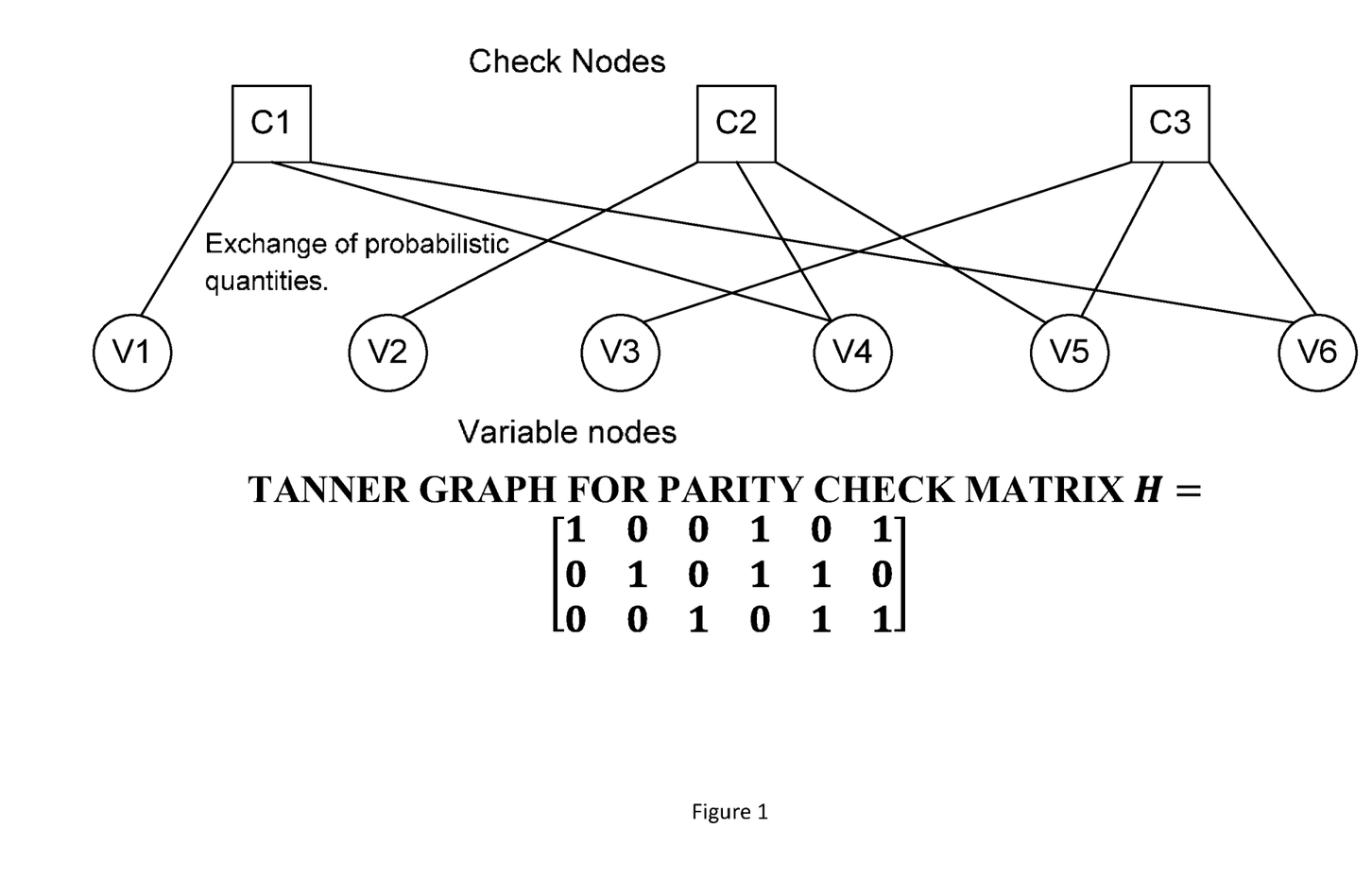
FIG. 1 illustrates a tanner graph for a parity check matrix, H.

It would be good to understand the general procedure of decoding and how the complexity is associated with the LDPC decoder. LDPC use message passing algorithms and can be understood by the representation of a Tanner graph. Any LDPC code can be illustrated by a Tanner graph, as shown in FIG. 1. FIG. 1 illustrates a tanner graph for a parity check matrix, H. The values of matrix H are shown in FIG. 1.

For LDPC codes, the Tanner graph can represent the parity check matrix with two nodes, known as check and variable nodes. In FIG. 1, check nodes are illustrated with squares and bit nodes are shown with circles. There are M (3 in the example) check nodes and N (6 in the example) variable nodes which corresponding to the number of rows and columns in matrix H, respectively. The check nodes are connected to the variable nodes based on the ones in matrix H. The branches between nodes are considered in the message passing algorithms such that iterative computation of probabilistic quantities is possible.

In the LDPC decoding process, likelihoods obtained from soft-decision components of a received vector r initialize the variable nodes and iteratively calculate relevant probabilistic values such that decoding of bits improve with the number of iterations. When the number of variable and check nodes are large, complexity and latency of decoding increases.

For NR eMBB, quasi-cyclic (QC) LDPC is adopted where LDPC codes have low-complexity encoding and parity-check matrix of a QC-LDPC code is given as an array of sparse circulants of the same size. The circulant size, or shift size, determines the complexity of the implementation together with the dimensions of parity check matrix. In NR LDPC design, two base graphs are introduced and parameters of LDPC designs are summarized in the table shown in FIG. 5.

Figure 5:
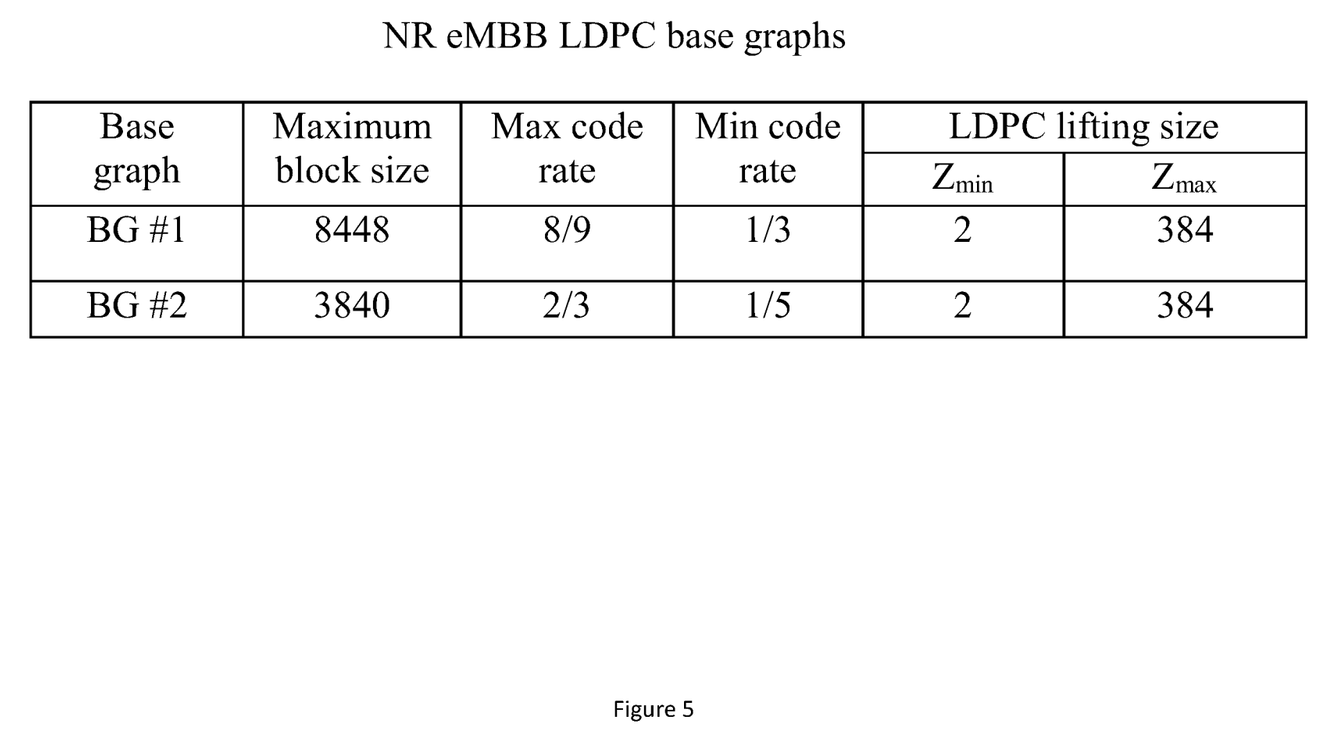
FIG. 5 illustrates NR eMBB LDPC base graphs.

FIG. 5 illustrates NR eMBB LDPC base graphs. As shown, each may have a maximum block size, a maximum code rate, a minimum code rate, and maximum and minimum LDPC lifting sizes.

Figure 2:
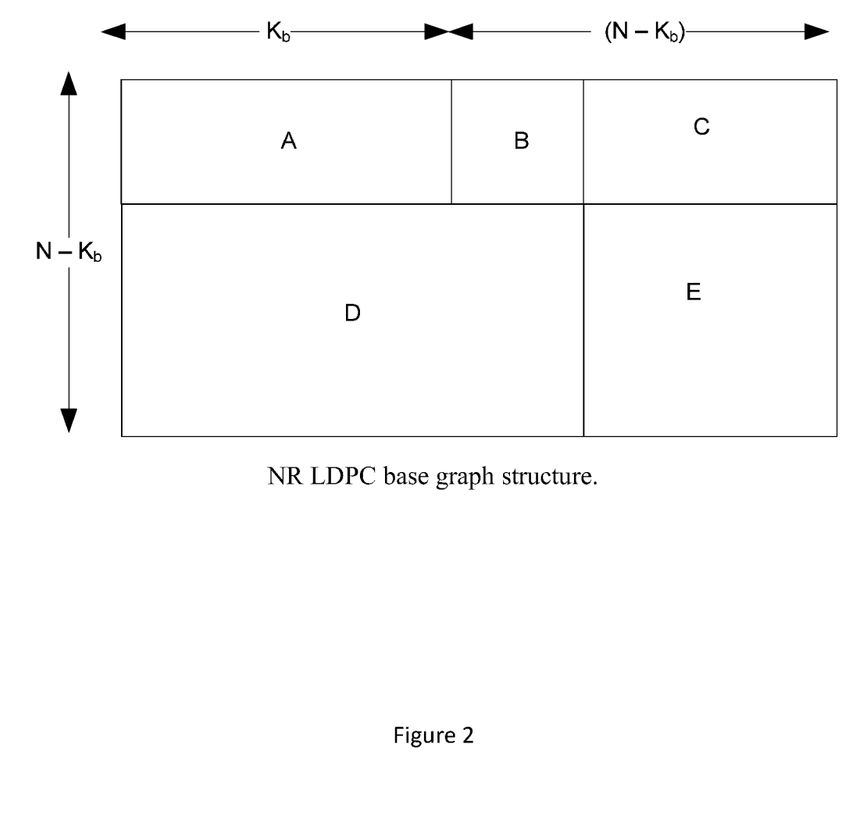
FIG. 2 illustrates NR LDPC base graph structure.

FIG. 2 illustrates NR LDPC base graph structure. In FIG. 2, $K_b$ refers to the number of columns to which information bits or systematic bits are mapped. More particularly, FIG. 2 provides the structure of the NR LDPC base graphs, where A corresponds to systematic bits, B is square and corresponds to parity bits. In B, the first column has weight three and the columns after the weight three column have a dual diagonal structure (i.e., main diagonal and off-diagonal), C is a zero matrix, D corresponds to systematic and parity bits, and E is an identity matrix. Basically, this base graph can be represented with ones and zeros where circulant entry is defined at non-zero locations to get the parity check matrices.

SUMMARY

According to certain embodiments, a method can include communicating at least one transport block for ultra-reliable low-latency communications between a sending device and a receiving device. The transport block can be coded using a base graph according to one of the following three options: using only low density parity check base graph #2; using only low density parity check base graph #2 and truncated low density parity check base graph #1; or using low density parity check base graph #2, truncated low density parity check base graph #1, and low density parity check base graph #3.

In certain embodiments, an apparatus can include at least one processor and at least one memory including computer program code. The at least one memory and the computer program code can be configured to, with the at least one processor, cause the apparatus at least to communicate at least one transport block for ultra-reliable low-latency communications between a sending device and a receiving device. The transport block can be coded using a base graph according to one of the following three options: using only low density parity check base graph #2; using only low density parity check base graph #2 and truncated low density parity check base graph #1; or using low density parity check base graph #2, truncated low density parity check base graph #1, and low density parity check base graph #3.

An apparatus can, according to certain embodiments, include means for communicating at least one transport block for ultra-reliable low-latency communications between a sending device and a receiving device. The transport block can be coded using a base graph according to one of the following three options: using only low density parity check base graph #2; using only low density parity check base graph #2 and truncated low density parity check base graph #1; or using low density parity check base graph #2, truncated low density parity check base graph #1, and low density parity check base graph #3.

A non-transitory computer-readable medium can, in certain embodiments, be encoded with instructions that, when executed in hardware, perform a process. The process can include communicating at least one transport block for ultra-reliable low-latency communications between a sending device and a receiving device. The transport block can be coded using a base graph according to one of the following three options: using only low density parity check base graph #2; using only low density parity check base graph #2 and truncated low density parity check base graph #1; or using low density parity check base graph #2, truncated low density parity check base graph #1, and low density parity check base graph #3.

According to certain embodiments, a computer program product can encode instructions for performing a process. The process can include communicating at least one transport block for ultra-reliable low-latency communications between a sending device and a receiving device. The transport block can be coded using a base graph according to one of the following three options: using only low density parity check base graph #2; using only low density parity check base graph #2 and truncated low density parity check base graph #1; or using low density parity check base graph #2, truncated low density parity check base graph #1, and low density parity check base graph #3.

BRIEF DESCRIPTION OF THE DRAWINGS

For proper understanding of the invention, reference should be made to the accompanying drawings, wherein.

DETAILED DESCRIPTION

LDPC codes in eMBB are mainly targeted for hybrid automatic repeat request (HARQ) support as a rate compatible extension. The flexibility of the supported code block sizes is designed to have a smooth operation across a broad range of eMBB services. BG #1 has larger dimensions and may determine the hardware complexity associated with the decoding. By contrast, BG #2 has lower dimensions, and the complexity associated with BG #2 may not increase the overall hardware complexity. There are several concerns when using the same codes for the URLLC scenario.

Hardware may need to be budgeted according to the BG #1 dimensions. The maximum number of variable nodes in BG #1 is $68*Z_{max}$ where $Z_{max}$ is the max shift size. Max shift size in the NR eMBB case is 384.

Additionally, URLLC is mainly operating with lower code rates, where BG #2 may be used in most of the time. To support low latency requirements, there may be a limitation of retransmissions and the focus may be mainly on decoding with a single shot. If multiple transmissions are allowed, the number of retransmission may be limited to meet the latency targets. Thus, incremental redundancy (IR) HARQ gains may not be that crucial for operation.

Moreover, current LDPC codes have error floors in certain block sizes, and these may be visible at $10^{-5}$ block error rate (BLER) region. As URLLC may need to support low BLER targets, an efficient mechanism may be needed to support this.

Furthermore, introducing a completely different coding scheme for URLLC may not be feasible as to base station implementations nor for the UEs which are supporting both eMBB and URLLC services. Therefore, efficient reuse of the existing codes may be advantageous and beneficial.

Certain embodiments address these concerns and provide a solution that may involve an efficient reuse of codes.

Figure 3:
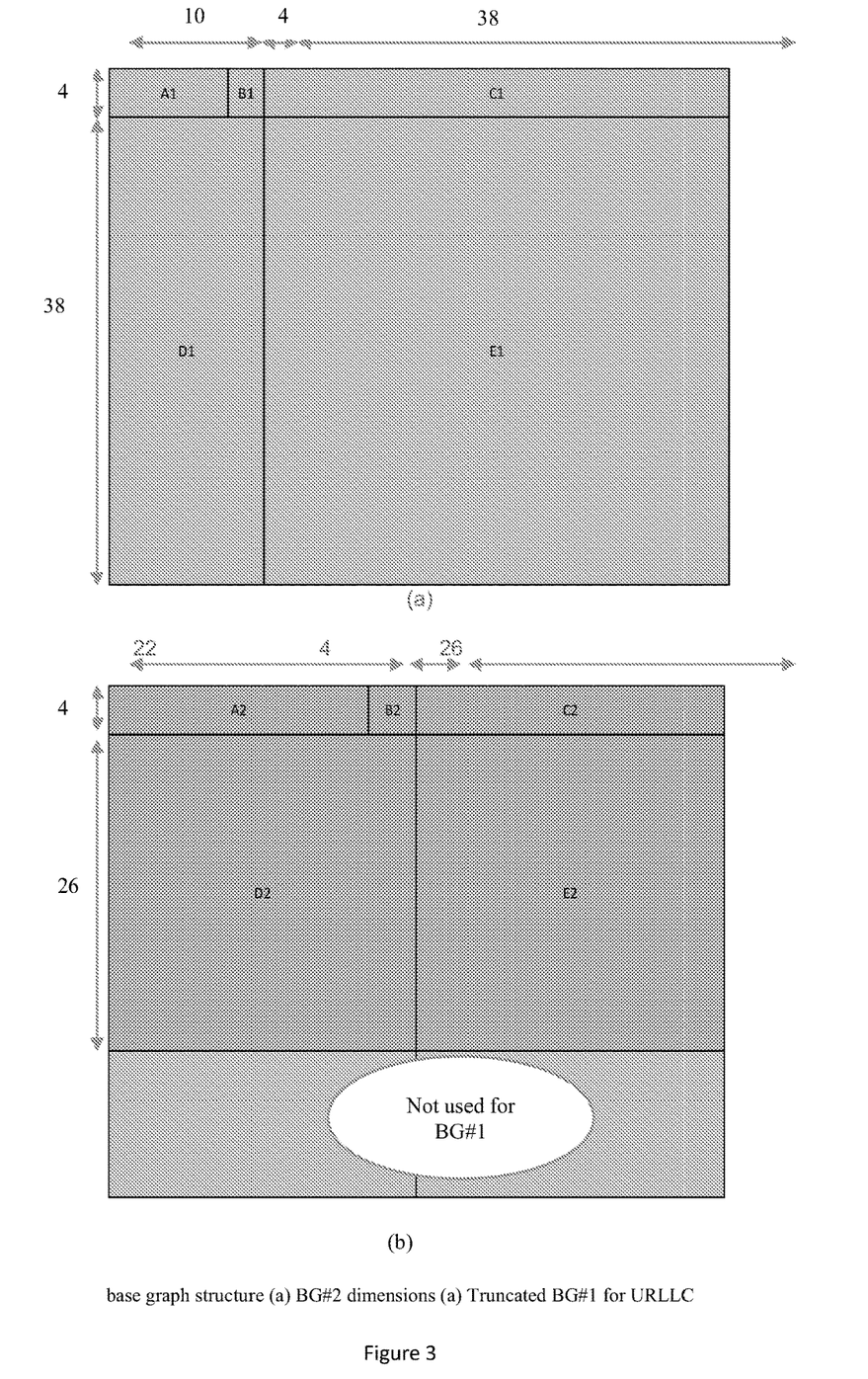
FIG. 3 illustrates base graphs according to certain embodiments.

FIG. 3 illustrates base graphs according to certain embodiments. More particularly, certain embodiments may maximize the reuse of existing LDPC codes for the URLLC scenario. The LDPC codes can be reused or redesigned based on the following principles.

First, the LDPC base graph #2 dimensions (42 rows and 52 columns) can be considered as the baseline when defining other base graphs. LDPC BG #1 can be truncated such that lowest code rate supported by the BG #1 is increased compared to the original design (which was 1/3). The new dimension of the truncated LDPC BG #1 can have the structure provided in FIG. 3 at (b). FIG. 3 at (a) shows the original dimensions of BG #2.

Truncated LDPC BG #1 can support higher code rates as well as rates as low as 22/50=0.44. Complexity can be reduced for URLLC services as a significant reduction in the number of variable nodes can be achieved via this truncation.

Introducing a new base graph is also possible within the dimensions of BG #2. URLLC services can operate with lower block sizes. The performance of existing parity check matrices may not be suitable in this range. Also, the lowest code rate of BG #2 is 1/5, and repetition may need to support lower rates than that at this moment. Introducing a new base graph for lower rates can improve the performance of the LDPC codes. Therefore, the following dimensions can be considered as BG #3.

For understanding, the notations A3, B3, C3, D3, and E3 can be used and can follow similar principles to those described above. In this discussion, A3 can be a 6*4 matrix, B3 can be a 4*4 matrix, C3 can be a 4*42 matrix, D3 can be a 42*10 matrix, and E3 can be a 42*42 matrix.

This arrangement can provide rates from 6/8 to 6/50 as natural code rates in the base graph. Also, the base graph complexity is not increased due to the limitation of the dimensions provided from BG #2. Other combinations are also possible for BG #3 designs following the same principles.

Figure 6:
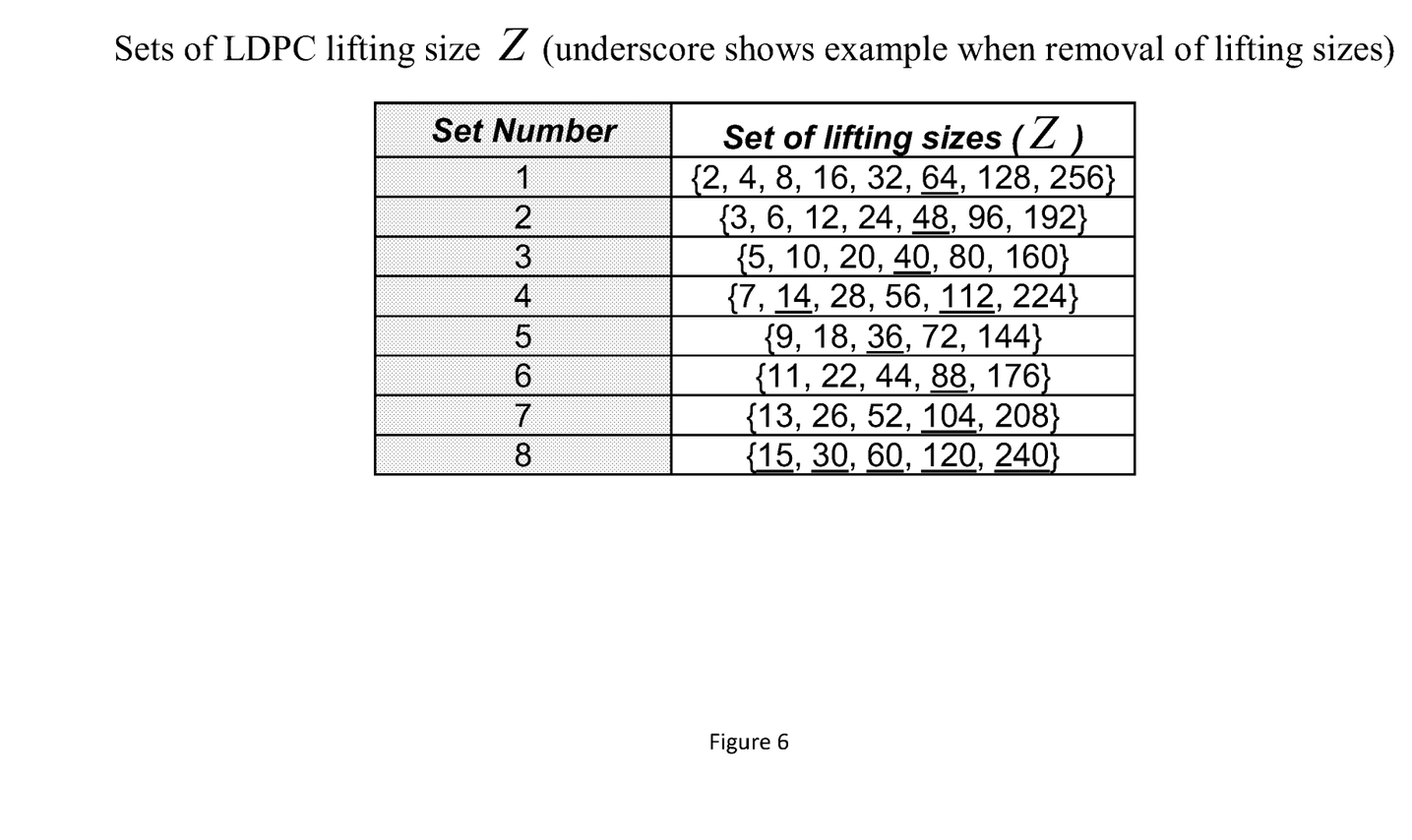
FIG. 6 illustrates a table of sets of lifting sizes with certain lifting sizes identified for removal, according to certain embodiments.

Second, the set of shift sizes used for eMBB is bit large and associated with some level of complexity. This many shift sizes can restrict the implementation with low latency. Also, certain parity check matrices in BG #2 have some error floors at some code block sizes. To avoid this, the following options are possible. A maximum shift size can be reduced to 256. Also, certain lifting sizes can be removed to make the code block granularity much sparser. The selection of the sets can help to avoid an error floor. FIG. 6 illustrates a table of sets of lifting sizes with certain lifting sizes identified for removal, according to certain embodiments.

When defining the transport block size (TBS) determination for URLLC, the set of TBS can be limited, the outcome will be the same as by reducing the set of lifting sizes, where we will get only a sub-set of shift sizes supported by the eMBB scenario.

Third, the use of base graphs can be as follows depending on the number of base graphs that we define for URLLC.

Figure 4:
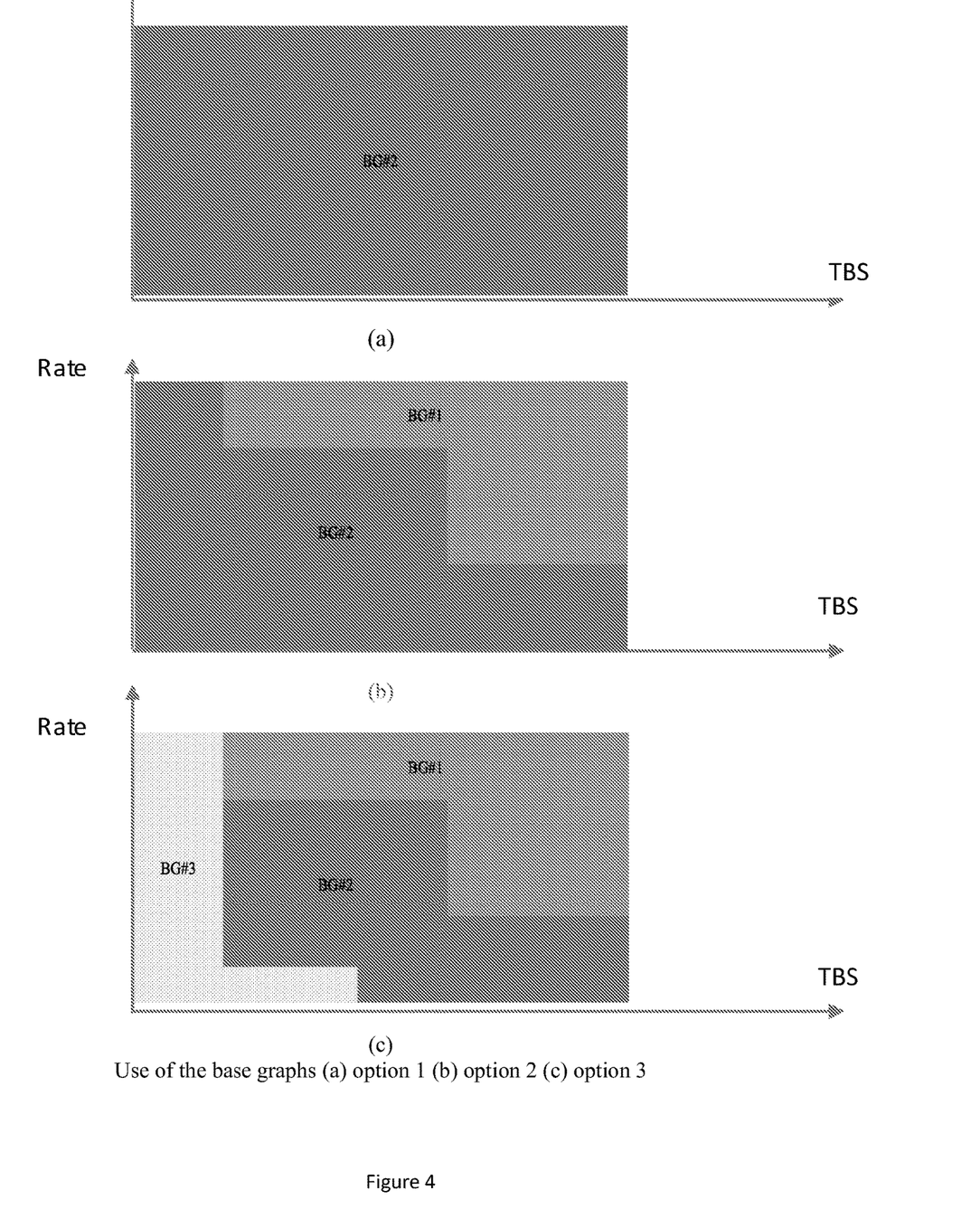
FIG. 4 illustrates three options for the use of base graphs, according to certain embodiments.

FIG. 4 illustrates three options for the use of base graphs, according to certain embodiments.

FIG. 4 at (a) illustrates option 1, in which only BG #2 is used for URLLC. The numbers of these options is for ease of reference only, and not by way of limitation or preference. All rates can block sizes supported by BG #2 can be used. Segmentation can happen when the TBS is larger than 2544. TB level cyclic redundancy check (CRC) below 2544 is 16 bits and above that it is 24 CRC bits. Also, each segment (if any) can use 24 CRC bits.

FIG. 4 at (b) illustrates option 2, in which BG #2 and truncated BG #1 are used for URLLC. In this option, if TBS<=292, or if TBS<=2544 and rate<=0.67, or if rate<=0.44, then BG #2 can be used. All other cases can be supported by truncated BG #1. For BG #2 in this option, segmentation happens when the TBS is larger than 2544. TB level CRC below 2544 is 16 bits and above that it is 24 CRC bits. Also, each segment (if any) can use 24 CRC bits. For BG #1, segmentation will apply when the TBS is larger than 5608. Also, TB and each segment (if any) can use 24 CRC bits.

FIG. 4 at (c) illustrates option 3, in which BG #2, truncated BG #1, and new BG #3 are used for URLLC. In this option, if TBS<=292, or TBS<=K1 (between 292 and 2544) and rate<=R1 (below 1/3), BG #3 can be used. Otherwise, if TBS<=2544 and rate<=0.67, or if rate<=0.44, BG #2 can be used. In all other cases, truncated BG #1 can be used.

For BG #2 in this example, segmentation happens when the TBS is larger than 2544. TB level CRC below 2544 is 16 bits and above that it is 24 CRC bits. Each segment (if any) can use 24 CRC bits.

For BG #1 in this example, segmentation will apply when the TBS is larger than 5608. TB and each segment (if any) can use 24 CRC bits.

For BG #3 in this example, segmentation will apply when the TBS is larger than K1. Each segment (if any) can use 16 CRC bits.

Fourth, it is also possible to operate URLLC without TB level CRC. In that case, extra CRC bits can be included in the code block (CB) level CRC attachment. Not applying TB level CRC may help for low latency processing in upper layers. Just after one CB is decoded, the CB can be sent to upper layers without waiting to decode another CB. However, a flag saying that this is not the final TB can be indicated to upper layers to make sure that this is only a part of the TB and not the full packet. More importantly, extra CRC bits can be included in the CB level to compensate the loss in FAR at TB level.

Certain embodiments have various benefits and/or advantages. For example, certain embodiments allow the efficient reuse of the eMBB LDPC codes and straightforward implementations.

Figure 7:
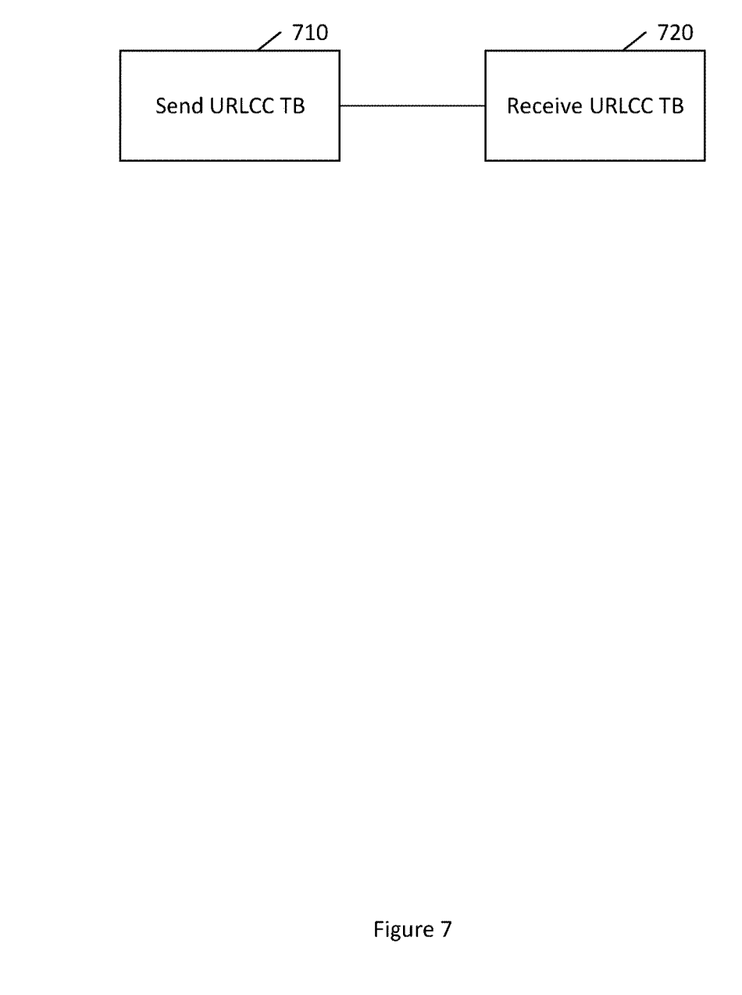
FIG. 7 illustrates a method according to certain embodiments.

FIG. 7 illustrates a method according to certain embodiments. A method can include, at 710, sending a URLCC TB by a sending device. This URLCC TB can be received at 720 by a receiving device. Thus, a method can include communicating at least one transport block for ultra-reliable low-latency communications between a sending device and a receiving device. The transport block can be coded using a base graph according to one of the following three options: using only low density parity check base graph #2; using only low density parity check base graph #2 and truncated low density parity check base graph #1; or using low density parity check base graph #2, truncated low density parity check base graph #1, and low density parity check base graph #3. These base graph numbers can refer to the illustrative examples set forth above.

In these examples, a maximum shift size can be 256. The sending device can be limited to a subset of lifting sizes. The subset can be configured to make code block granularity sparser. Likewise, the sending device can be limited to a subset of transport block sizes. The subset of transport block sizes can be configured to limit supported shift sizes to a sub-set.

When using only low density parity check base graph #2 according option 1 described above, the sending device can be configured to use 24 cyclic redundancy check bits per segment.

When using only low density parity check base graph #2 and truncated low density parity check base graph #1 according to option 2 described above, the sending device can be configured to use low density parity check base graph #2 only a predetermined condition is met. The predetermined condition can be that a transport block size is less than or equal to 292, a transport block size is less than or equal to 2544 and a rate is less than or equal to 0.67, or a rate is less than or equal to 0.44.

When using only low density parity check base graph #2 and truncated low density parity check base graph #1 according to option 2 described above, when specifically using low density parity check base graph #2 the sending device can be configured to use 24 cyclic redundancy check bits per segment when the transport block size is larger than 2544, and 16 cyclic redundancy check bits per segment otherwise. On the other hand, when specifically using truncated low density parity check base graph #1 according to this same option 2, the sending device can be configured to use 24 cyclic redundancy check bits per segment.

When using low density parity check base graph #2, truncated low density parity check base graph #1, and low density parity check base graph #3 according to option 2 described above, the method can include selecting to specifically use low density parity check base graph #3 based on a transport block size, rate, or a combination of block size and rate.

Figure 8:
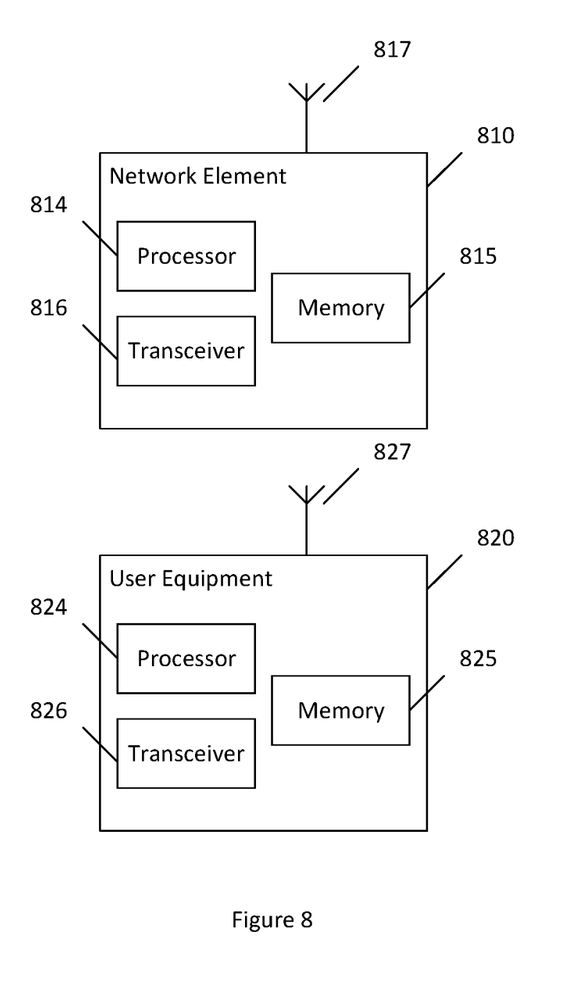
FIG. 8 illustrates a system according to certain embodiments.

FIG. 8 illustrates a system according to certain embodiments of the invention. It should be understood that each block of the flowchart of FIG. 1 may be implemented by various means or their combinations, such as hardware, software, firmware, one or more processors and/or circuitry. In one embodiment, a system may include several devices, such as, for example, network element 810 and user equipment (UE) or user device 820. The system may include more than one UE 820 and more than one network element 810, although only one of each is shown for the purposes of illustration. A network element can be an access point, a base station, an eNode B (eNB), or any other network element, such as a next generation Node B (gNB).

Each of these devices may include at least one processor or control unit or module, respectively indicated as 814 and 824. At least one memory may be provided in each device, and indicated as 815 and 825, respectively. The memory may include computer program instructions or computer code contained therein, for example for carrying out the embodiments described above. One or more transceiver 816 and 826 may be provided, and each device may also include an antenna, respectively illustrated as 817 and 827. Although only one antenna each is shown, many antennas and multiple antenna elements may be provided to each of the devices. Other configurations of these devices, for example, may be provided. For example, network element 810 and UE 820 may be additionally configured for wired communication, in addition to wireless communication, and in such a case antennas 817 and 827 may illustrate any form of communication hardware, without being limited to merely an antenna.

Transceivers 816 and 826 may each, independently, be a transmitter, a receiver, or both a transmitter and a receiver, or a unit or device that may be configured both for transmission and reception. The transmitter and/or receiver (as far as radio parts are concerned) may also be implemented as a remote radio head which is not located in the device itself, but in a mast, for example. It should also be appreciated that according to the "liquid" or flexible radio concept, the operations and functionalities may be performed in different entities, such as nodes, hosts or servers, in a flexible manner. In other words, division of labor may vary case by case. One possible use is to make a network element to deliver local content. One or more functionalities may also be implemented as a virtual application that is provided as software that can run on a server.

A user device or user equipment 820 may be a mobile station (MS) such as a mobile phone or smart phone or multimedia device, a computer, such as a tablet, provided with wireless communication capabilities, personal data or digital assistant (PDA) provided with wireless communication capabilities, vehicle, portable media player, digital camera, pocket video camera, navigation unit provided with wireless communication capabilities or any combinations thereof. The user device or user equipment 820 may be a sensor or smart meter, or other device that may usually be configured for a single location.

In an exemplifying embodiment, an apparatus, such as a node or user device, may include means for carrying out embodiments described above in relation to FIG. 1.

Processors 814 and 824 may be embodied by any computational or data processing device, such as a central processing unit (CPU), digital signal processor (DSP), application specific integrated circuit (ASIC), programmable logic devices (PLDs), field programmable gate arrays (FPGAs), digitally enhanced circuits, or comparable device or a combination thereof. The processors may be implemented as a single controller, or a plurality of controllers or processors. Additionally, the processors may be implemented as a pool of processors in a local configuration, in a cloud configuration, or in a combination thereof. The term circuitry may refer to one or more electric or electronic circuits. The term processor may refer to circuitry, such as logic circuitry, that responds to and processes instructions that drive a computer.

For firmware or software, the implementation may include modules or units of at least one chip set (e.g., procedures, functions, and so on). Memories 815 and 825 may independently be any suitable storage device, such as a non-transitory computer-readable medium. A hard disk drive (HDD), random access memory (RAM), flash memory, or other suitable memory may be used. The memories may be combined on a single integrated circuit as the processor, or may be separate therefrom. Furthermore, the computer program instructions may be stored in the memory and which may be processed by the processors can be any suitable form of computer program code, for example, a compiled or interpreted computer program written in any suitable programming language. The memory or data storage entity is typically internal but may also be external or a combination thereof, such as in the case when additional memory capacity is obtained from a service provider. The memory may be fixed or removable.

The memory and the computer program instructions may be configured, with the processor for the particular device, to cause a hardware apparatus such as network element 810 and/or UE 820, to perform any of the processes described above (see, for example, FIG. 1). Therefore, in certain embodiments, a non-transitory computer-readable medium may be encoded with computer instructions or one or more computer program (such as added or updated software routine, applet or macro) that, when executed in hardware, may perform a process such as one of the processes described herein. Computer programs may be coded by a programming language, which may be a high-level programming language, such as objective-C, C, C++, C#, Java, etc., or a low-level programming language, such as a machine language, or assembler. Alternatively, certain embodiments of the invention may be performed entirely in hardware.

Furthermore, although FIG. 8 illustrates a system including a network element 810 and a UE 820, embodiments of the invention may be applicable to other configurations, and configurations involving additional elements, as illustrated and discussed herein. For example, multiple user equipment devices and multiple network elements may be present, or other nodes providing similar functionality, such as nodes that combine the functionality of a user equipment and an access point, such as a relay node.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

LIST OF ABBREVIATIONS

LDPC—low density parity check
TBS—transport block size
CRC—cyclic redundancy check
eMBB—enhanced mobile broadband
URLLC—ultra reliable low latency communication
NR—new radio

What is claimed is:
1. A method, comprising:
communicating at least one transport block for ultra-reliable low-latency communications between a sending device and a receiving device, wherein the transport block is associated with a base graph according to one of the following options:
using only low density parity check base graph #2 and truncated low density parity check base graph #1, wherein transport block sizes and code rates of the low density parity check base graphs only partially overlap each other,
wherein if transport block sizes are less than 292, transport block sizes are less than 2544 and rate<=0.67, or if rate<=0.44, base graph #2 can be used, otherwise base graph #1 is used,
wherein for base graph #2 segmentation happens when transport block size is larger than 2544 and for base graph #1 segmentation happens when the transport block size is larger than 5608,
wherein dimensions of truncated low density parity check base graph #1 do not exceed dimensions of low density parity check base graph #2, wherein when using only low density parity check base graph #2 and truncated low density parity check base graph #1, the sending device is configured to use low density parity check base graph #2 only when a predetermined condition is met, wherein when using only low density parity check base graph #2 and truncated low density parity check base graph #1, when specifically using low density parity check base graph #2 the sending device is configured to use 24 cyclic redundancy check bits per segment when the transport block size is larger than 2544, and 16 cyclic redundancy check bits per transport block otherwise, wherein when using only low density parity check base graph #2 and truncated low density parity check base graph #1, when specifically using truncated low density parity check base graph #1 the sending device is configured to use 24 cyclic redundancy check bits per segment; or using low density parity check base graph #2, truncated low density parity check base graph #1, and low density parity check base graph #3, wherein transport block sizes and code rates of the low density parity check base graphs only partially overlap each other, wherein if transport block sizes are less than 292, transport block sizes are between 292 and 2544 and rate is below 1/3 base graph #3 can be used, if transport block sizes are less than 2544 and rate<=0.67, or if rate<=0.44, base graph #2 can be used, otherwise base graph #1 is used, wherein for base graph #3 segmentation happens when transport block sizes are between 292 and 2544, for base graph #2 segmentation happens when the transport block size is larger than 2544 and for base graph #1 segmentation happens when the transport block size is larger than 5608, wherein dimensions of truncated low density parity check base graph #1, low density parity check base graph #2, and low density parity check base graph #3 are at most 42 rows and 52 columns each, wherein a maximum shift size of any of the low density parity check base graph #2, the truncated low density parity check base graph #1, and the low density parity check base graph #3 is 256, wherein the sending device is limited to a subset of lifting sizes, wherein the subset is configured to make code block granularity sparser, and to avoid an error floor, wherein the sending device is limited to a subset of transport block sizes, wherein the subset of transport block sizes is configured to limit supported shift sizes to a sub-set.

2. The method of claim 1, wherein dimensions of low density parity check base graph #3 do not exceed dimensions of low density parity check base graph #2.

3. The method of claim 1, wherein when using only low density parity check base graph #2, the sending device is configured to use 24 cyclic redundancy check bits per segment.

4. An apparatus, comprising:
at least one processor; and
at least one memory including computer program code, wherein the at least one memory and the computer program code are configured to, with the at least one processor, cause the apparatus at least to:
communicate at least one transport block for ultra-reliable low-latency communications between a sending device and a receiving device, wherein the transport block is associated with a base graph according to one of the following options:

using only low density parity check base graph #2 and truncated low density parity check base graph #1, wherein transport block sizes and code rates of the low density parity check base graphs only partially overlap each other, wherein if transport block sizes are less than 292, transport block sizes are less than 2544 and rate<=0.67, or if rate<=0.44, base graph #2 can be used, otherwise base graph #1 is used, wherein for base graph #2 segmentation happens when transport block size is larger than 2544 and for base graph #1 segmentation happens when the transport block size is larger than 5608, wherein dimensions of truncated low density parity check base graph #1 do not exceed dimensions of low density parity check base graph #2, wherein when using only low density parity check base graph #2 and truncated low density parity check base graph #1, the sending device is configured to use low density parity check base graph #2 only when a predetermined condition is met, wherein when using only low density parity check base graph #2 and truncated low density parity check base graph #1, when specifically using low density parity check base graph #2 the sending device is configured to use 24 cyclic redundancy check bits per segment when the transport block size is larger than 2544, and 16 cyclic redundancy check bits per transport block otherwise, wherein when using only low density parity check base graph #2 and truncated low density parity check base graph #1, when specifically using truncated low density parity check base graph #1 the sending device is configured to use 24 cyclic redundancy check bits per segment; or using low density parity check base graph #2, truncated low density parity check base graph #1, and low density parity check base graph #3, wherein transport block sizes and code rates of the low density parity check base graphs only partially overlap each other, wherein if transport block sizes are less than 292, transport block sizes are between 292 and 2544 and rate is below 1/3 base graph #3 can be used, if transport block sizes are less than 2544 and rate<=0.67, or if rate<=0.44, base graph #2 can be used, otherwise base graph #1 is used, wherein for base graph #3 segmentation happens when transport block sizes are between 292 and 2544, for base graph #2 segmentation happens when the transport block size is larger than 2544 and for base graph #1 segmentation happens when the transport block size is larger than 5608, wherein dimensions of truncated low density parity check base graph #1, low density parity check base graph #2, and low density parity check base graph #3 are at most 42 rows and 52 columns each, wherein a maximum shift size of any of the low density parity check base graph #2, the truncated low density parity check base graph #1, and the low density parity check base graph #3 is 256, wherein the sending device is limited to a subset of lifting sizes, wherein the subset is configured to make code block granularity sparser, and to avoid an error floor, wherein the sending device is limited to a subset of transport block sizes, wherein the subset of transport block sizes is configured to limit supported shift sizes to a sub-set.

5. The apparatus of claim 4, wherein dimensions of low density parity check base graph #3 do not exceed dimensions of low density parity check base graph #2.

6. The apparatus of claim 4, wherein when using only low density parity check base graph #2, the sending device is configured to use 24 cyclic redundancy check bits per segment.

7. A non-transitory computer-readable medium encoded with instructions that, when executed in hardware, cause the hardware to perform:
communicating at least one transport block for ultra-reliable low-latency communications between a sending device and a receiving device, wherein the transport block is associated with a base graph according to one of the following options:
using only low density parity check base graph #2 and truncated low density parity check base graph #1, wherein transport block sizes and code rates of the low density parity check base graphs only partially overlap each other,
wherein if transport block sizes are less than 292, transport block sizes are less than 2544 and rate<=0.67, or if rate<=0.44, base graph #2 can be used, otherwise base graph #1 is used,
wherein for base graph #2 segmentation happens when transport block size is larger than 2544 and for base graph #1 segmentation happens when the transport block size is larger than 5608,
wherein dimensions of truncated low density parity check base graph #1 do not exceed dimensions of low density parity check base graph #2,
wherein when using only low density parity check base graph #2 and truncated low density parity check base graph #1, the sending device is configured to use low density parity check base graph #2 only when a predetermined condition is met,
wherein when using only low density parity check base graph #2 and truncated low density parity check base graph #1, when specifically using low density parity check base graph #2 the sending device is configured to use 24 cyclic redundancy check bits per segment when the transport block size is larger than 2544, and 16 cyclic redundancy check bits per transport block otherwise,
wherein when using only low density parity check base graph #2 and truncated low density parity check base graph #1, when specifically using truncated low density parity check base graph #1 the sending device is configured to use 24 cyclic redundancy check bits per segment; or
using low density parity check base graph #2, truncated low density parity check base graph #1, and low density parity check base graph #3, wherein transport block sizes and code rates of the low density parity check base graphs only partially overlap each other,
wherein if transport block sizes are less than 292, transport block sizes are between 292 and 2544 and rate is below 1/3 base graph #3 can be used, if transport block sizes are less than 2544 and rate<=0.67, or if rate<=0.44, base graph #2 can be used, otherwise base graph #1 is used,
wherein for base graph #3 segmentation happens when transport block sizes are between 292 and 2544, for base graph #2 segmentation happens when the transport block size is larger than 2544 and for base graph #1 segmentation happens when the transport block size is larger than 5608,
wherein dimensions of truncated low density parity check base graph #1, low density parity check base graph #2, and low density parity check base graph #3 are at most 42 rows and 52 columns each,
wherein a maximum shift size of any of the low density parity check base graph #2, the truncated low density parity check base graph #1, and the low density parity check base graph #3 is 256,
wherein the sending device is limited to a subset of lifting sizes, wherein the subset is configured to make code block granularity sparser, and to avoid an error floor,
wherein the sending device is limited to a subset of transport block sizes, wherein the subset of transport block sizes is configured to limit supported shift sizes to a sub-set.

* * * * *